United States Patent
Lai et al.

(10) Patent No.: US 6,927,485 B2
(45) Date of Patent: Aug. 9, 2005

(54) SUBSTRATE FOR SEMICONDUCTOR PACKAGE

(75) Inventors: Yu-Ting Lai, Taichung (TW); Ken-Hung Kuo, Taichung (TW); Shy-Hwa Feng, Taichung (TW)

(73) Assignee: Siliconware Precision Industries Co., Ltd. (TW)

( * ) Notice: Subject to any disclaimer, the term of this patent is extended or adjusted under 35 U.S.C. 154(b) by 0 days.

(21) Appl. No.: 10/241,076

(22) Filed: Sep. 11, 2002

(65) Prior Publication Data

US 2004/0032014 A1 Feb. 19, 2004

(30) Foreign Application Priority Data

Aug. 14, 2002 (TW) .......................... 91118259 A (51) Int. Cl.⁷ .................. H01L 23/02; H01L 23/48; H01L 23/52; H01L 23/053
(52) U.S. Cl. .................. 257/686; 257/701; 257/780; 257/730; 257/784; 257/787; 257/690
(58) Field of Search ................. 257/701, 702, 257/780, 690, 691, 692, 730, 784, 787, 686; 174/255, 260, 258

(56) References Cited

U.S. PATENT DOCUMENTS

| | | | |
|---|---|---|---|
| 5,216,278 A | 6/1993 | Lin et al. ............. | 257/688 |
| 5,640,048 A * | 6/1997 | Selna ................. | 257/738 |
| 5,677,575 A * | 10/1997 | Maeta et al. .......... | 257/778 |
| 5,689,091 A * | 11/1997 | Hamzehdoost et al. ... | 174/255 |
| 6,111,306 A * | 8/2000 | Kawahara et al. ...... | 257/666 |
| 6,204,559 B1 * | 3/2001 | Lin et al. ............ | 257/738 |

\* cited by examiner

*Primary Examiner*—Nitin Parekh
(74) *Attorney, Agent, or Firm*—Peter F. Corless; Steven M. Jensen; Edwards & Angell, LLP (57) ABSTRACT

A substrate for a semiconductor package is provided, which includes: a core layer; at least a metal layer applied over each of upper and lower surfaces of the core layer, wherein the metal layer on the upper surface forms a plurality of conductive traces each having a terminal, and the metal layer on the lower surface is defined with a conductive region and a surrounding peripheral region, allowing the conductive region to form a plurality of conductive traces each having a terminal; and an insulating layer applied over each of the metal layers, wherein terminals of the conductive traces and at least a corner portion of the peripheral region are exposed to outside of the insulating layers. During fabrication of semiconductor packages, after a post molding curing process, the vertically-stacked substrates can be easily separated by virtue of a gap being formed between exposed corner portions of the stacked substrates.

11 Claims, 7 Drawing Sheets

SUBSTRATE FOR SEMICONDUCTOR PACKAGE

FIELD OF THE INVENTION

The present invention relates to substrates for semiconductor packages, and more particularly, to a substrate for use as a chip carrier where a chip is mounted.

BACKGROUND OF THE INVENTION

Ball grid array (BGA) semiconductor packages adopt advanced and widely employed packaging technology, which is characterized by using a plurality of array-arranged solder balls as input/output (I/O) ports of the semiconductor packages for electrically connecting chips mounted in the semiconductor packages to external devices such as printed circuit boards.

Figure 6A:
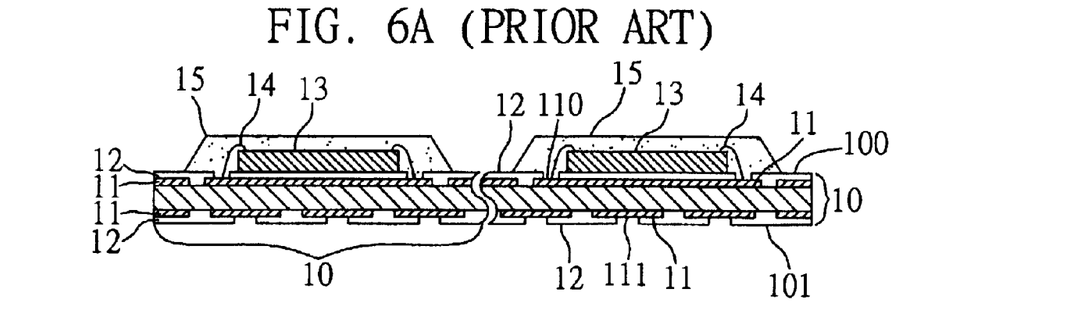
FIGS. 6A–6C (PRIOR ART) are cross-sectional diagrams showing fabrication processes for conventional semiconductor packages.

U.S. Pat. No. 5,216,278 discloses a BGA semiconductor package with a substrate as a chip carrier, which can be fabricated by the following procedural steps. As shown in FIG. 6A, the first step is to prepare a substrate 10 formed with at least a layer of metal traces (not shown), the substrate 10 having an upper surface 100 and a lower surface 101 opposed to the upper surface 100. The upper and lower surfaces 100, 101 are each formed with a plurality of copper-made conductive traces 11 thereon. A solder mask layer 12 is applied over each of the upper and lower surfaces 100, 101 for encapsulating the conductive traces 11, allowing terminals 110, 111 of the conductive traces 11 to be exposed to outside of the solder mask layers 12 The next step is to mount at least a chip 13 on the upper surface 100 of the substrate 10. Then, a plurality of bonding wires 14 are bonded to the chip 13 and to the exposed terminals 110 used as bond fingers on the upper surface 100 of the substrate 10, so as to electrically connect the chip 13 to the substrate 10 by means of the bonding wires 14; the exposed terminals 111 on the lower surface 101 of the substrate 10 are used as ball pads where solder balls (not shown) may be subsequently implanted. Thereafter, a molding process is performed to form at least an encapsulant 15 on the upper surface 100 of the substrate 10, the encapsulant 15 being adapted to hermetically encapsulate the chip 13 and the bonding wires 14.

Figure 6B:
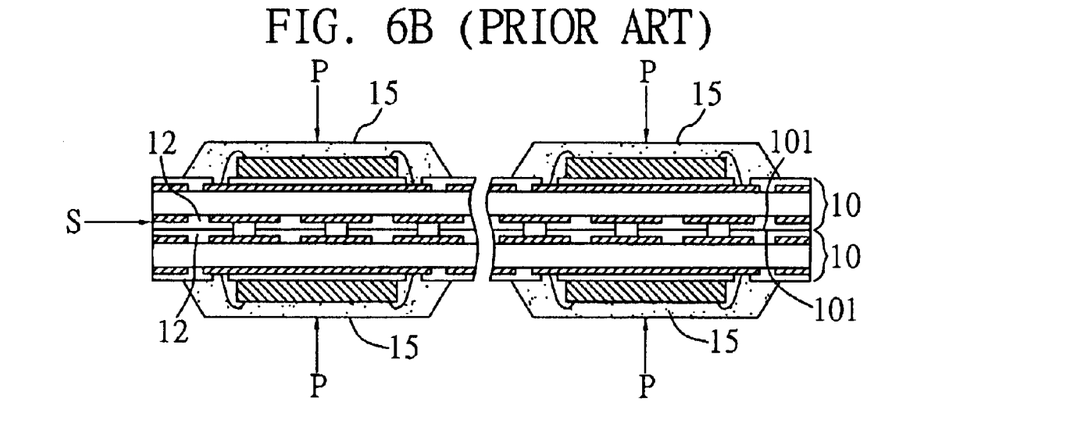
Figure 6C:
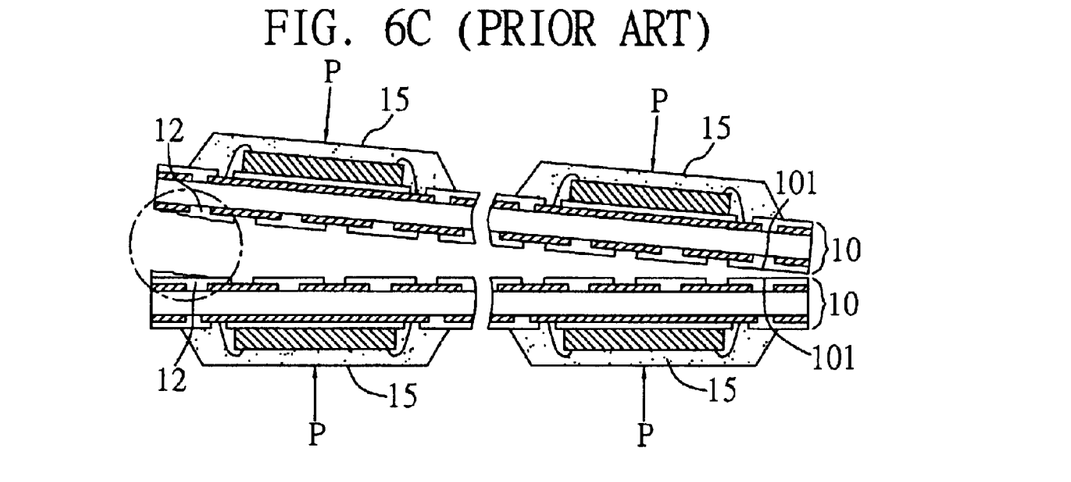

After molding, as shown in FIG. 6B, the substrates 10 mounted with the chips 13 are vertically stacked in a back-to-back manner with the lower surfaces 101 thereof being in contact with each other, and readily subject to a post molding curing (PMC) process, wherein the stacked substrates 10 are clamped at peripheral part thereof by a clamping mechanism (not shown), which applies a pressure P to the substrates 10 for securing the substrates 10 in position without being warped during a subsequent curing process. Then, the stacked substrates 10 are placed into an oven (not shown), and undergo curing implemented at around 175° C. for around 6 hours, so as to allow a resin compound that fabricates the encapsulants 15 to form cross-link between high molecular-weight molecules thereof and thus to be cured. After completing the PMC process, the stacked substrates 10 are removed from the oven (not shown), and a thin blade or iron plate (not shown) is used to separate apart the inter-contact lower surfaces 101 of the stacked substrates 10, as shown in FIG. 6C. Finally, ball-implantation and singulation processes are carried out to form individual semiconductor packages; these processes are conventional and not to be here illustrated by drawings.

However, during the PMC process, the solder mask layers 12 on the inter-contact lower surfaces 101 of the stacked substrates 10 are pressurized and heated to be softened and adhered to each other, thereby increasing adhesion between the stacked substrates 10. As a result, during separating the stacked substrates 10, the thin blade or iron plate (not shown) may be easily introduced at inaccurate or deviated positions, for example, along a direction of an arrow S shown in FIG. 6B to cut into the solder mask layer 12 of the lower surface 101 of the upper substrate 10 (or the lower substrate 10, not indicated by an arrow in FIG. 6B); this would undesirably crack the solder mask layer 12 (as circled in FIG. 6C), and damage quality and yield of fabricated package products.

SUMMARY OF THE INVENTION

A primary objective of the present invention is to provide a substrate for a semiconductor package, which can effectively assure structural intactness of the substrate during fabrication of the semiconductor package, thereby improving quality and yield of fabricated package products.

In accordance with the above and other objectives, the present invention proposes a substrate for a semiconductor package, comprising: a core layer having an upper surface and a lower surface opposed to the upper surface; at least a metal layer (such as a copper layer) respectively applied over the upper and lower surfaces of the core layer, wherein the metal layer on the upper surface of the core layer is adapted to form a plurality of conductive traces, each of the conductive traces having a terminal, and wherein the metal layer on the lower surface of the core layer is defined with a conductive region and a peripheral region surrounding the conductive region, and the conductive region is adapted to form a plurality of conductive traces, each of the conductive traces having a terminal; and an insulating layer (such as solder mask) applied over each of the metal layers, allowing the terminals of the conductive traces and at least a corner portion of the peripheral region to be exposed to outside of the insulating layer. In another embodiment, at least a corner position of the core layer corresponding in position to the exposed corner portion of the metal layer is exposed to outside of the insulating layer.

During fabrication of semiconductor packages through the use of the above substrates, as exposed corner portions of the metal layers or exposed corner positions of the core layers form at least a gap between the substrates that are vertically stacked with lower surfaces thereof being in contact with each other during a curing process, the stacked substrates would be easily separated after curing through the use of a thin blade or iron plate applied into the gap without damaging the substrates, such that solder-mask cracking problems in the prior art due to inaccurate separation can be prevented, and thus reliability of subsequent fabrication processes and quality and yield of fabricated products can be assured.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

Preferred embodiments for a substrate proposed in the present invention and a semiconductor package through the use of the substrate are described in details as follows with reference to FIGS. 1–5.
First Preferred Embodiment
FIGS. 1A–1D illustrate fabrication processes for substrates 20 according to a first preferred embodiment of the invention; the substrates 20 are fabricated in a batch manner.

Figure 1A:
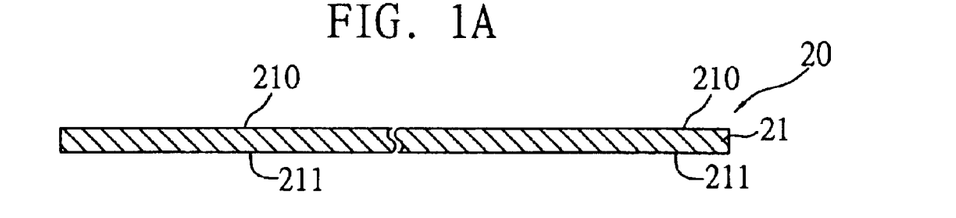
FIGS. 1A–1D are cross-sectional diagrams showing fabrication processes for substrates according to a first preferred embodiment of the invention.

Referring to FIG. 1A, the first step is to prepare a core layer 21 having an upper surface 210 and a lower surface 211 opposed to the up surface 210. The core layer 21 may be made of a conventional resin material such as epoxy resin, polyimide resin, BT (bismaleimide triazine) resin, FR4 resin, etc.

Figure 1B:
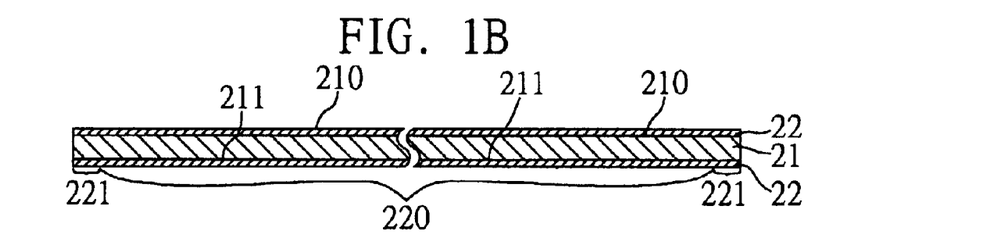

Referring to FIG. 1B, the next step is to apply at least a metal layer 22 such as a copper layer respectively over the upper and lower surfaces 210, 211 of the core layer 21, wherein the metal layer 22 formed on the lower surface 211 of the core layer 21 is defined with a conductive region 220 and a peripheral region 221 surrounding the conductive region 220.

Figure 1C:
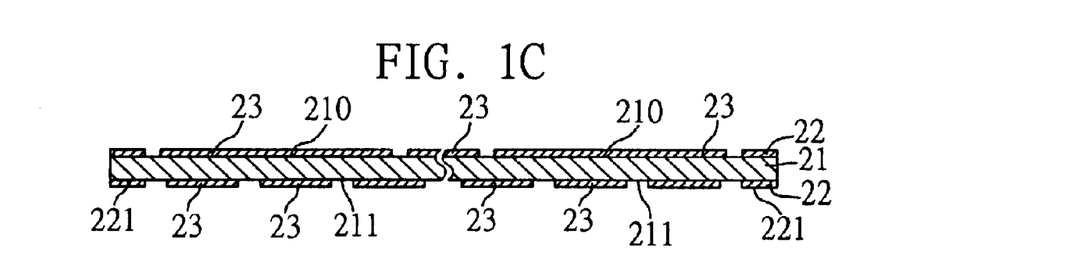

Referring to FIG. 1C, conventional exposing, developing and etching processes are employed to pattern the metal layers 22 formed on the upper and lower surfaces 210, 211 of the core layer 21, wherein the metal layer 22 on the upper surface 210 of the core layer 21 and the conductive region 220 of the metal layer 22 on the lower surface 211 of the core layer 21 are respectively adapted to form a plurality of conductive traces 23.

Figure 1D:
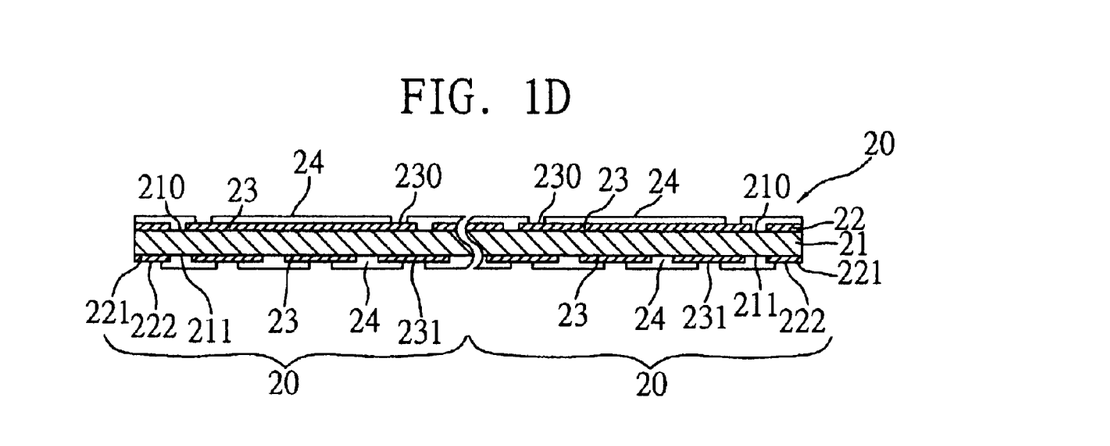
Figure 2:
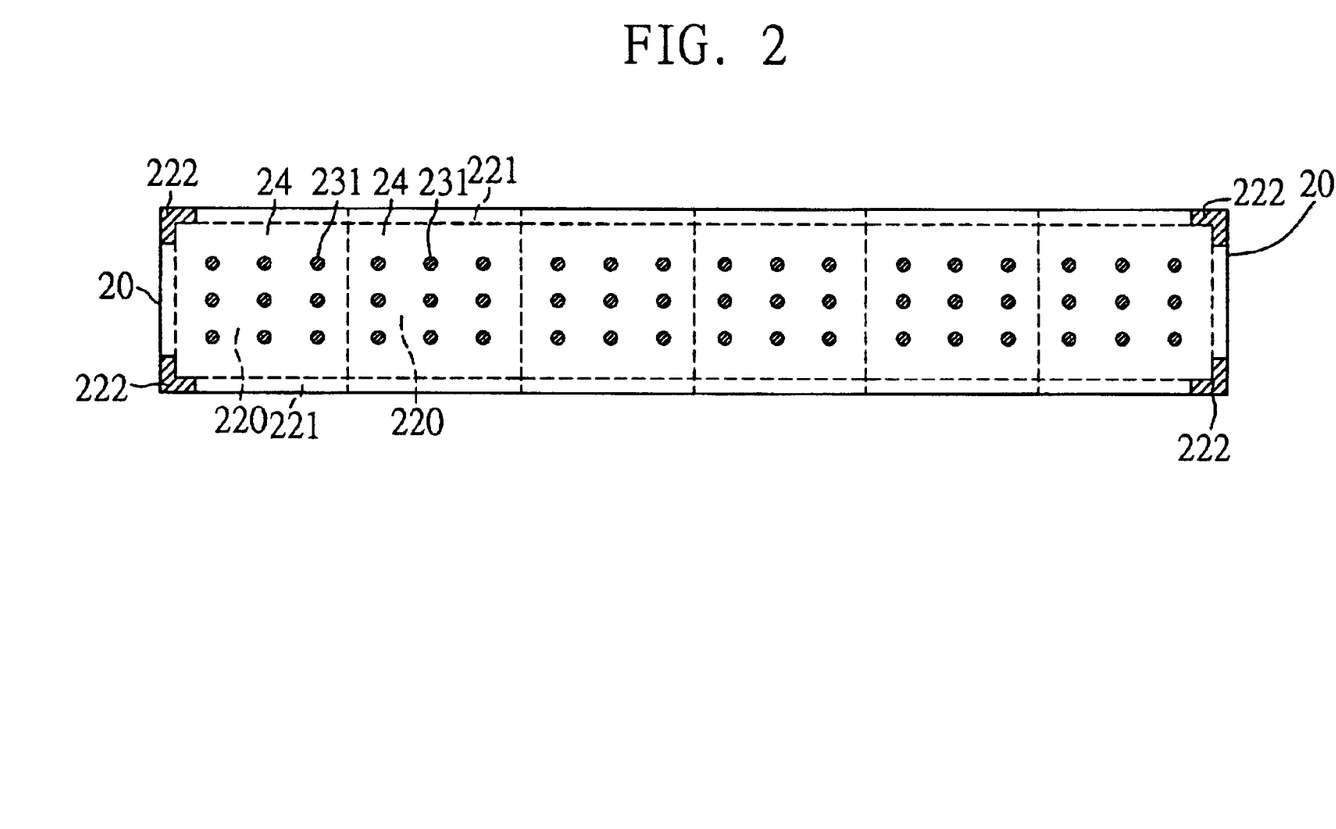
FIG. 2 is a bottom view of the substrates according to the first preferred embodiment of the invention.

Referring to FIG. 1D, an insulating layer 24 such as solder mask is respectively applied over the metal layers 22 formed on the upper and lower surfaces 210, 211 of the core layer 21, allowing predetermined positions (such as terminals) 230, 231 of the conductive traces 23 and corner portions 222 of the peripheral region 221 to be exposed to outside of the insulating layers 24 by performing a conventional etching process, as shown in FIG. 2.

The conductive traces 23, except the exposed terminals 230, 231, are covered by the insulating layers 24 and protected against damage from external moisture or contaminants, thereby preventing short-circuiting problems from occurrence in subsequent fabrication processes. The exposed terminals 230 of the conductive traces 23 on the upper surface 210 of the core layer 21 are used as bond fingers for subsequently attaching bonding wires (not shown) or solder bumps (not shown) thereon; the exposed terminals 231 of the conductive traces 23 on the lower surface 211 of the core layer 21 are used as ball pads for subsequently implanting solder balls (not shown) thereon. This therefore completes batch-fabrication of the substrates 20 according to the invention, as shown in FIG. 1D.

Figure 3A:
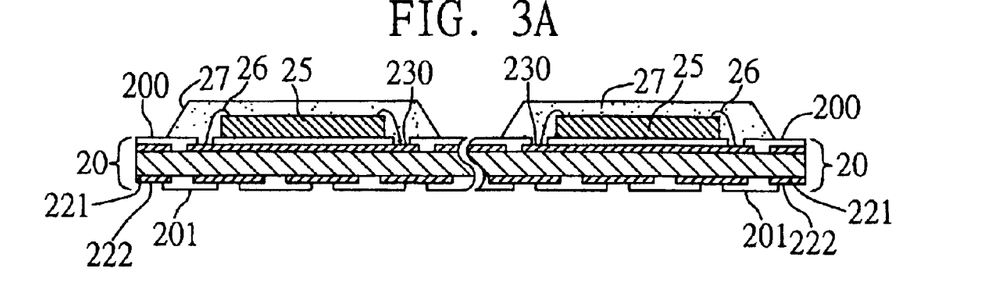
FIGS. 3A–3D are cross-sectional diagrams showing fabrication processes for semiconductor packages through the use of the substrates according to the first preferred embodiment of the invention.

FIGS. 3A–3D illustrate fabrication processes for semiconductor packages 2 through the use of the above substrates 20. Referring to FIG. 3A, the first step is to prepare the substrates 20 through the use of the above fabrication method, wherein each of the substrates 20 has an upper surface 200 and a lower surface 201 opposed to the upper surface 200.

A chip-bonding process is performed to mount at least a chip 25 over the upper surface 200 of each of the substrates 20. Then, a wire-bonding process is implemented to form a plurality of bonding wires 26 (such as gold wires) that are bonded to the chip 25 and to corresponding bond fingers 230, to thereby electrically connect the chip 25 to the corresponding one of the substrates 20.

Then, a molding process is carried out to form an encapsulant 27 on the upper surface 200 of each of the substrates 20. The encapsulant 27 is made of a conventional resin compound such as epoxy resin, and hermetically encapsulates and protects the corresponding chip 25 and bonding wires 26 against damage from external moisture or contaminants.

Figure 3B:
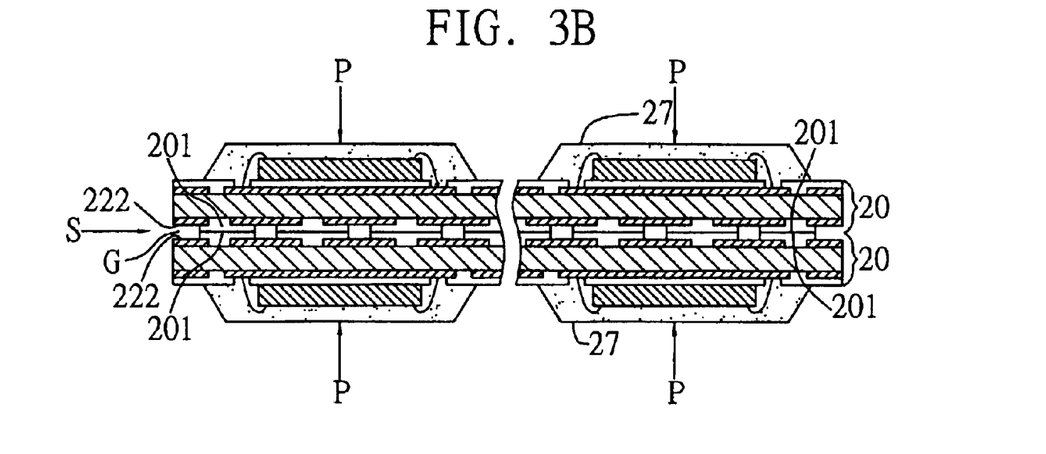

Referring to FIG. 3B, a post molding curing (PMC) process is performed. After molding, the substrates 20 mounted with the chips 25 are vertically stacked in a back-to-back manner with the lower surfaces 201 thereof being in contact with each other. A clamping mechanism (not shown) is adopted to clamp peripheral part of the stacked substrates 20 and apply a pressure P to secure the substrates 20 in position, so as to prevent the substrates 20 from being warped in a subsequent curing process. Then, the stacked substrates 20 are placed into an oven (not shown) and undergo curing at around 175° C. for around 6 hours to cure the encapsulants 27.

Figure 3C:
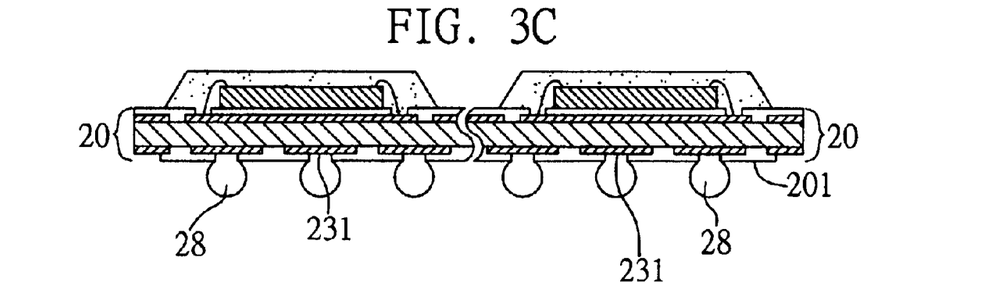

Referring to FIG. 3C, a thin blade or iron plate (not shown) may be utilized to separate apart the stacked substrates 20 along a direction of an arrow S shown in FIG. 3B. Then, a ball-implantation process is performed to bond a plurality of solder balls 28 to exposed ball pads 231 on the lower surface 201 of each of the substrates 20. The solder balls 28 serve as input/output (I/O) ports for electrically connecting the chips 25 to external device such as printed circuit boards.

As exposed corner portions 222 of the metal layers 22 form at least a gap G between the vertically-stacked substrates 20 (as shown in FIG. 3B), the stacked substrates 20 would be easily separated through the use of the thin blade or iron plate (not shown) applied into the gap G without damaging the substrates 20, such that solder-mask cracking problems in the prior art due to inaccurate separation can be prevented, and thus reliability of subsequent fabrication processes and quality and yield of fabricated products can be assured.

Figure 3D:
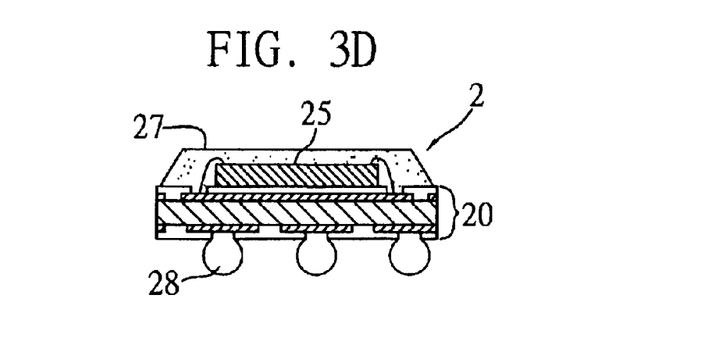
Figure 4A:
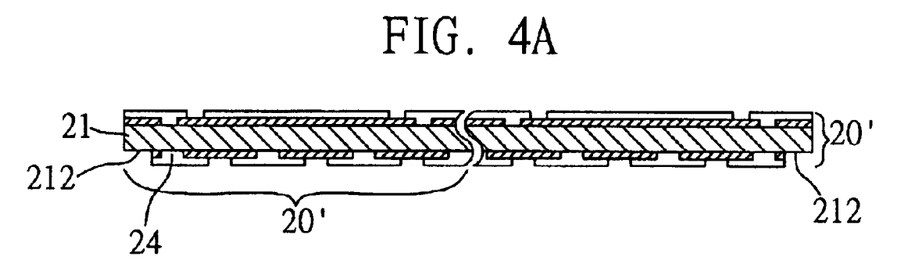
FIGS. 4A and 4B are respectively a cross-sectional view and a bottom view of the substrates according to a second preferred embodiment of the invention.
Figure 4B:
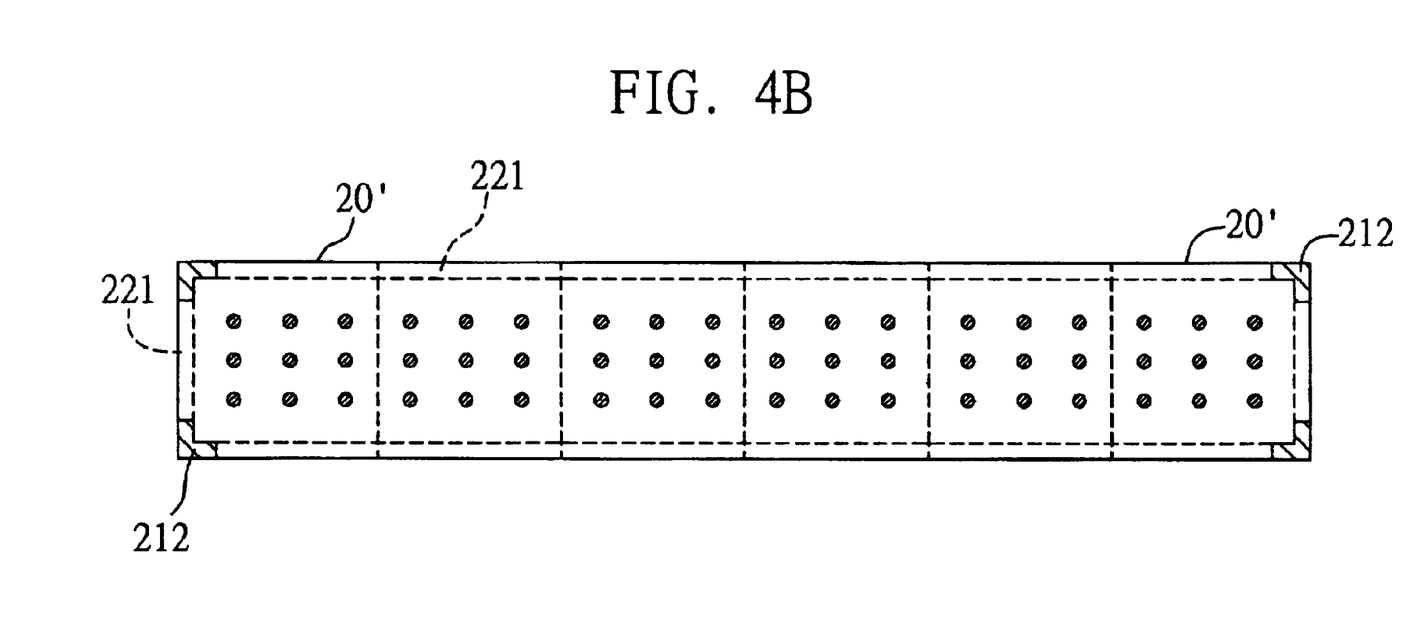

Finally, referring to FIG. 3D, a singulation process is performed to cut apart the batch-fabricated substrates 20 and to form individual semiconductor packages 2, wherein a portion of the substrates 20 corresponding in position to the peripheral region 221 of the metal layer 22 is cut off without remaining in the fabricated semiconductor packages 2.
Second Preferred Embodiment
FIGS. 4A and 4B illustrates substrate 20' according to a second preferred embodiment of the invention. The substrates 20' are structurally similar to the above substrates 20 of the first embodiment, and have components thereof being designated with the same reference numerals as those used for the above substrates 20.

As shown in FIGS. 4A and 4B, the substrates 20' differ from the above substrates 20 in that, corner portions of a peripheral region 221 of the metal layer 22 are removed to expose corresponding corner positions 212 of the core layer 21 outside of the insulating layer 24.

Figure 5A:
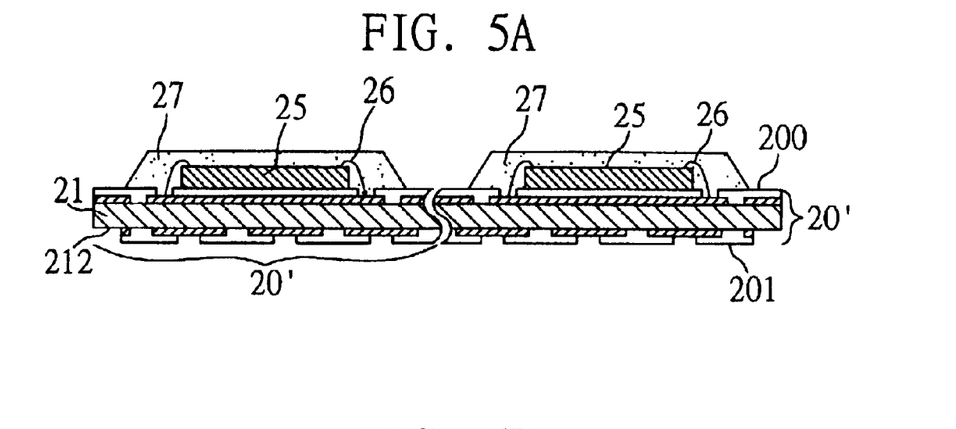
FIGS. 5A–5C are cross-sectional diagrams showing fabrication processes for semiconductor packages through the use of the substrates according to the second preferred embodiment of the invention.
Figure 5B:
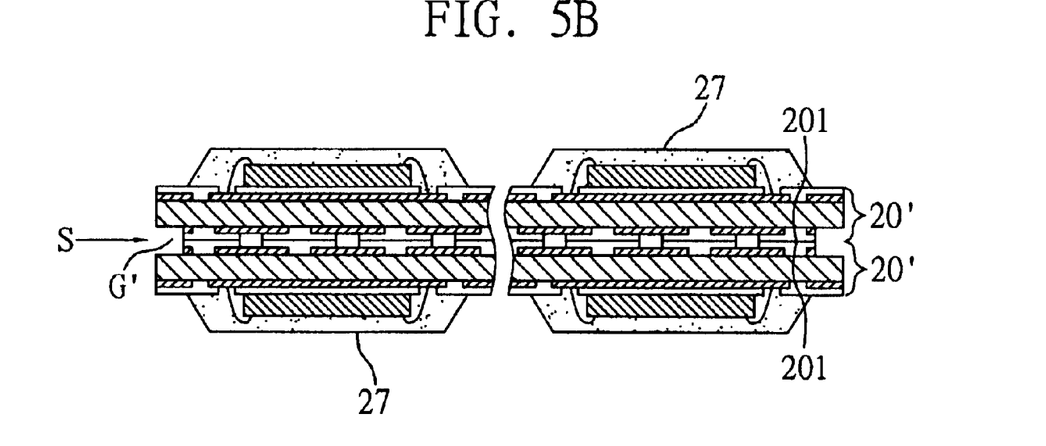
Figure 5C:
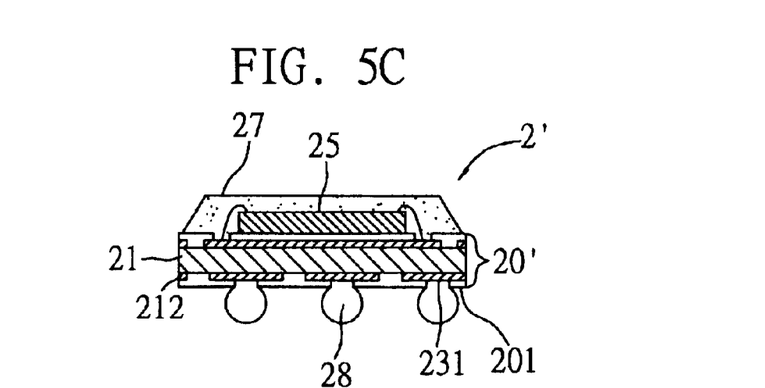

FIGS. 5A–5C illustrate fabrication processes for semiconductor package 2' through the use of the substrates 20'. Referring to FIG. 5A, the first step is to prepare the substrates 20' shown in FIGS. 4A and 4B, each of the substrates 20' having an upper surface 200 and a lower surface 201 opposed to the upper surface 200.

At least a chip 25 is mounted on the upper surface 200 of each of the substrates 20', and electrically connected to the corresponding one of the substrates 20' by means of a plurality of bonding wires 26.

Then, a molding process is carried out to form an encapsulant 27 on the upper surface 200 of each of the substrates 20', allowing the chips 25 and bonding wires 26 to be hermetically encapsulated by the encapsulants 27.

Referring to FIG. 5B, a PMC process is performed. After molding, the substrates 20' mounted with the chips 25 are vertically stacked with the lower surfaces 201 thereof being in contact with each other. A clamping mechanism (not shown) is adopted to secure the stacked substrates 20' in position. Then, the stacked substrates 20' are placed into an oven (not shown) and undergo curing at around 175° C. for around 6 hours to cure the encapsulants 27.

Referring to FIG. 5C, a thin blade or iron plate (not shown) may be utilized to separate the stacked substrates 20' along a direction of an arrow S shown in FIG. 5B. Then, a ball-implantation process is performed to bond a plurality of solder balls 28 to exposed ball pads 231 on the lower surface 201 of each of the substrates 20'. A singulation process is performed to cut apart the batch-fabricated substrates 20' and to form individual semiconductor packages 2'.

As exposed corner positions 212 of the core layers 21 form at least a gap G' between the vertically-stacked substrates 20' (as shown in FIG. 5B), the stacked substrates 20' would be easily separated through the use of the thin blade or iron plate (not shown) applied into the gap G without damaging the substrates 20', such that solder-mask cracking problems in the prior art due to inaccurate separation can be prevented, thereby assuring quality and yield of fabricated products.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A substrate for a semiconductor package, comprising:
   a core layer,
   at least a metal layer applied over at least a surface of the core layer, the metal layer being defined with a conductive region and a peripheral region surrounding the conductive region, wherein the conductive region is adapted to form a plurality of conductive traces, and each of the conductive traces has a terminal; and
   an insulating layer applied over the metal layer, allowing the terminals of the conductive traces and at least a corner portion of the peripheral region to be exposed to outside of the insulating layer, wherein a gap is formed between exposed corner portions of the metal layers of vertically stacked substrates and a portion of the substrate corresponding in position to the peripheral region of the metal layer is cut off and thus removed from the semiconductor package in a singulation process for cutting apart batch-fabricated substrates.

2. The substrate of claim 1, wherein the metal layer is a copper layer.

3. The substrate of claim 1, wherein a portion of the core layer corresponding in position to the exposed corner portion of the peripheral region is exposed to outside of the insulating layer.

4. The substrate of claim 1, wherein the insulating layer is made of solder mask.

5. The substrate of claim 1, wherein the terminals of the conductive traces are used for implanting solder balls thereon.

6. A substrate for a semiconductor package, comprising:
   a core layer having an upper surface and a lower surface opposed to the upper surface;
   at least a metal layer respectively applied over the upper and lower surfaces of the core layer, wherein the metal layer on the upper surface of the core layer is adapted to form a plurality of conductive traces, each of the conductive traces having a terminal, and wherein the metal layer on the lower surface of the core layer is defined with a conductive region and a peripheral region surrounding the conductive region, and the conductive region is adapted to form a plurality of conductive traces, each of the conductive traces having a terminal; and
   an insulating layer applied over each of the metal layers, allowing the terminals of the conductive traces and at least a corner portion of the peripheral region to be exposed outside of the insulating layer, wherein a gap is formed between exposed corner portions of the metal layers of vertically stacked substrates and a portion of the substrate corresponding in position to the peripheral region of the metal layer is cut off and thus removed from the semiconductor package in a singulation process for cutting apart batch-fabricated substrates.

7. The substrate of claim 6, wherein the metal layer is a copper layer.

8. The substrate of claim 6, wherein a portion of the core layer corresponding in position to the exposed corner portion of the peripheral region is exposed to outside of the insulating layer.

9. The substrate of claim 6, wherein the insulating layer is made of solder mask.

10. The substrate of claim 6, wherein the terminals of the conductive traces on the upper surface of the core layer are used for attaching bonding wires thereon.

11. The substrate of claim 6, wherein the terminals of the conductive traces on the lower surface of the core layer are used for implanting solder balls thereon.

* * * * *